United States Patent [19]

Ludwig

[11] 4,063,235
[45] Dec. 13, 1977

[54] NON-RETURN TO ZERO MARK TO NON-RETURN TO ZERO LEVEL CODE CONVERTER

[75] Inventor: Volker Ludwig, Gelting, Germany

[73] Assignee: Siemens Aktiengesellschaft, Berlin & Munich, Germany

[21] Appl. No.: 736,812

[22] Filed: Oct. 29, 1976

[30] Foreign Application Priority Data

Oct. 31, 1975  Germany .............................. 2548913

[51] Int. Cl.² .......................................... H03K 13/24
[52] U.S. Cl. ........................................... 340/347 DD
[58] Field of Search ............ 360/40, 41; 340/347 DD; 325/38 B; 178/66, 67, 68; 328/117

[56] References Cited

U.S. PATENT DOCUMENTS

| | | | |
|---|---|---|---|
| 3,434,059 | 9/1966 | Kesolits | 340/347 DD |
| 3,821,716 | 6/1974 | Ghajar | 360/40 |
| 4,001,578 | 1/1977 | Cook | 178/68 |

*Primary Examiner*—Charles D. Miller
*Attorney, Agent, or Firm*—Hill, Gross, Simpson, Van Santen, Steadman, Chiara & Simpson

[57] ABSTRACT

A circuit arrangement for reshaping a pulse edge data signal whose pulse edges signal binary values of data into an amplitude data signal whose amplitudes signal the binary values of the data includes a pulse generator to produce a timing signal having a period duration which is equal to the duration of the individual binary values. A pulse shaper is fed with the pulse edge data signal and emits a rectangular signal whose rectangular pulses are of short duration and coincide with the pulse edges of the pulse edge data signal. A first bistable trigger stage and a second bistable trigger stage are provided, each of which has a setting input, a data input, a pulse train input and an output, the output emitting signals having binary values which signal the stable states of the two trigger stages. The setting input of the first trigger stage is supplied with the rectangular signal and the pulse train input of the first trigger stage is fed with a timing signal. The first trigger stage assumes one of its two stable states when a rectangular pulse of the rectangular signal occurs and assumes the other of its two stable states when, in the absence of the rectangular pulses, a pulse edge of the timing signal is present at the pulse train input of the first trigger stage. The output of the first trigger stage is connected to the data input of the second trigger stage and the timing signal is fed to the pulse train input of the second trigger stage. The second trigger stage assumes the states of the first trigger stage when one of the edges of the timing signal occurs, and the amplitude data signal is emitted by way of the output of the second trigger stage.

3 Claims, 4 Drawing Figures

NON-RETURN TO ZERO MARK TO NON-RETURN TO ZERO LEVEL CODE CONVERTER

BACKGROUND OF THE INVENTION

1. Field of the Invention

The present invention relates to a circuit arrangement for reshaping a pulse edge data signal whose pulse edges signal binary values of data, into an amplitude data signal whose amplitudes signal the binary values of the data, and more particularly to a reshaping arrangement which can be used within a data transmission system for decoding a signal at the receiving end and in which a pulse generator is provided which produces a timing signal whose period duration is equal to the duration of the individual binary values.

2. Summary of the Invention

The object of the present invention is to provide a circuit arrangement for reshaping a pulse edge data signal into an amplitude data signal which is independent of the speed of the items of data to be transmitted.

According to the invention, a pulse shaper is provided which, at its input, is supplied with a pulse edge data signal and which, via its output, emits a rectangular signal whose rectangular pulses are short duration and coincide with the pulse edges of the pulse edge data signal. A first bistable trigger stage and a second bistable trigger stage are provided, each of which has a setting input, a data input, a pulse train input and an output. By way of the outputs of the two trigger stages signals are emitted whose binary values signal the two stable states of the circuits. The setting input of the first trigger stage is supplied with the rectangular signal. The timing signal input of the first trigger stage is supplied with the timing signal and the first trigger stage assumes one of its two stable states when a rectangular pulse of the rectangular signal occurs. The first trigger stage assumes the other of its two stable states when, in the absence of rectangular pulses of the rectangular signal, a pulse edge of the timing signal is present at the pulse train input of the first trigger stage. The output of the first trigger stage is connected to the data input of the second trigger stage, and the pulse train input of the second trigger stage is supplied with the timing signal. The second trigger stage assumes the states of the first trigger stage when one of the edges of the timing signal occurs and the amplitude data signal is emitted by way of the output of the second trigger stage.

A circuit arrangement constructed in accordance with the present invention is characterized in that the reshaping of the pulse edge data signal into the amplitude data signal is carried out independently of the speed of the items of data to be transmitted, because the reshaping is carried out in a purely digital fashion. The higher the speed of the items of data to be transmitted, the more rapdily, on the average, do the pulse edges of the pulse edge data signal follow one another, and the more rapidly also, on the average, do the rectangular pulses of short duration of the rectangular signal follow one another, and the higher is the speed at which the two trigger stages are operated, without the need to manually adapt the circuit arrangement to different data transmission speeds.

When the speed range of the data transmission speed is to be relatively high, it is expedient to produce a rectangular signal whose rectangular pulses have steep-gradient pulse edges and have only a short duration. A rectangular signal of this type can be produced at little expense with the aid of a differentiator element and a NOT-equivalence gate. To this end, the pulse edge data signal is fed, on the one hand, directly and, on the other hand, via the differentiator element, to, in each case, one input of the NOT equivalence gate, and via its output the steep-edged rectangular pulses of short duration are emitted.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
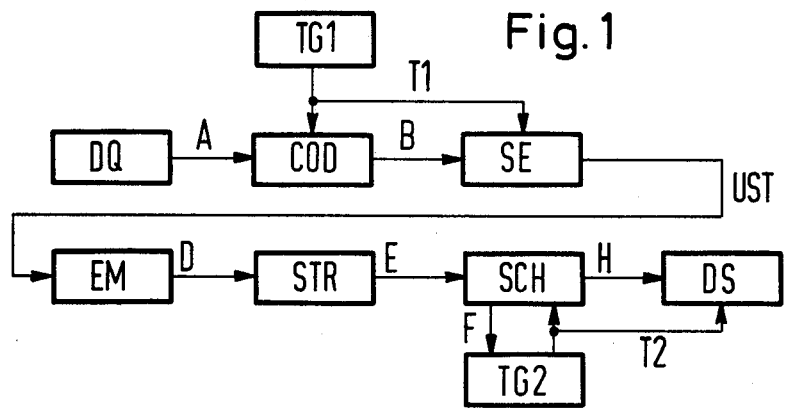
FIG. 1 is a block circuit diagram of a data transmission system.
Figure 4:
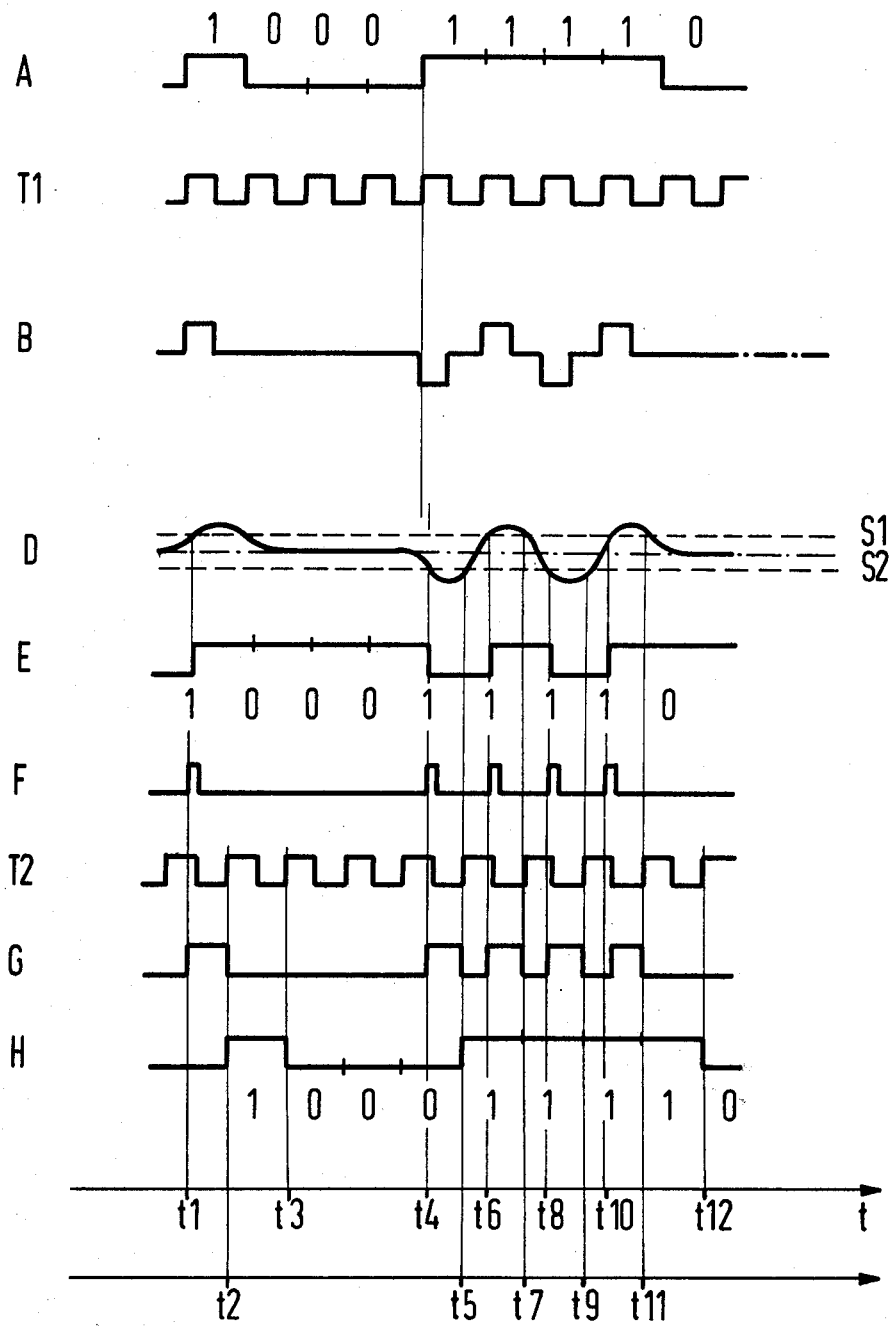
FIG. 4 illustrates signals which occur in the data transmission system illustrated in FIG. 1.

The data system illustrated in FIG. 1 contains data source DQ, a coder COD, a pulse generator TG1 and a modulator and transmitter SE at the transmitting end. The signals A, B, T1 are illustrated in FIG. 4. The abscissa directions relate to the time $t$. The signal A represents the items of data to be transmitted. The binary values of binary signals are referenced "1" and "0". Therefore, in the present example the word 100011110 is emitted from the data source DQ.

The pulse generator TG1 produces the timing signal T1 whose period duration is equal to the duration of the individual bits which are illustrated in association with the signal A. The timing signal T1 consists of individual, rectangular pulses whose duration is equal to half the bit duration.

In the coder COD the signal B is produced in dependence upon the signal A. Here only the 1-values of the signal A are taken into consideration inasmuch as with every 1-value of the signal A alternately a positive and negative rectangular pulse of the signal B is produced, whereas the 0-values of the signal A are not taken into account. For example, as a result of the first 1-value of the signal A, shortly before the time $t1$, a rectangular pulse of positive polarity of the signal B is produced. Shortly before the time $t4$, the next 1-value of the signal A begins, which is assigned a rectangular pulse of negative polarity of the signal B. The rectangular pulses of the signal B, which then follow, signal the consecutive 1-values of the siganl A with their alternating polarity. This type of coding and generation of the signal B is known per se and therefore will not be described herein in greater detail.

The signal B is fed to the modulator and transmitter SE by way of the output of the transmitter SE a base-band signal is transmitted across a transmission link UST in a known manner. It would also be conceivable to transmit the signal B with PCM modulation in a known manner.

A receiver EM, a Schmitt trigger STR, a circuit arrangement SCH, a pulse generator DG2 and a data sink DS are arranged at the receiving end. The signals D, E, H, F, T2 are also illustrated in FIG. 4. The receiver EM emits the signal D to the Schmitt trigger STR. The threshold values S1 and S2 are symmetrical to the dash-dotted 0-line in FIG. 4. In dependence upon these threshold values, the Schmitt trigger STR switches and emits the signal E. For example, the signal D reaches the threshold value S1 at the time $t1$ so that a positive edge of the signal E is formed. This value (E = 1) is maintained until the time $t4$ in that the signal D reaches the second threshold value S2. The value E = 0 is then maintained from the time $t4$ until the time $t6$, at which time the signal D again reaches the first threshold value S1. In this manner the signal E is produced whose pulse edges always signal the binary value "1". Here, the 0-values and the 1-values, as in the case of the signal A, are transmitted within the frame of a bit pattern. It is assumed that the bit pattern of the signal E occurs slightly later than the bit pattern of the signal A. If a pulse edge occurs at the times of the bit pattern of the signal E, this is always a 1-value and when no pulse edge occurs at the times of the bit pattern, a 0-value is signaled. On the whole, the signal E signals the same word 100011110 as the signal A.

With the circuit arrangement SCH, the signal H is derived from the signal E, the signal H having binary values which are now no longer signaled by the pulse edges but by amplitude stages. For example, the 1-value of the signal E which occurs at the time $t1$ is signaled with the 1-value of the signal H, which occurs from the time $t2$ until the time $t3$. On the whole, the signal H conveys the same word 100011110 as the signal E. The pulse generator TG2 corresponds to the transmitting end pulse generator TG1 and supplies the timing signal T2. The transmitted data are fed in the form of the data signal H to the data sink DS.

Figure 2:
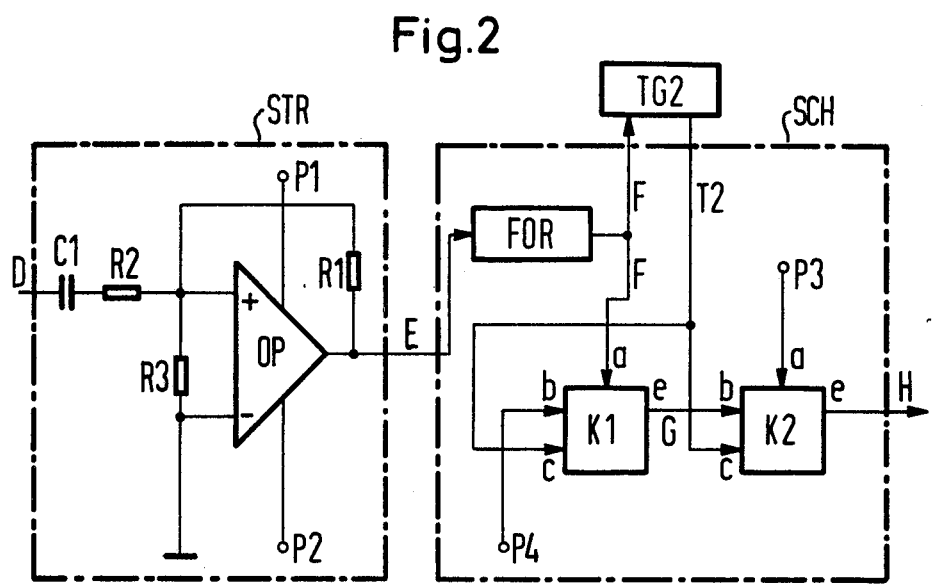
FIG. 2 is a more detailed illustration of a Schmitt trigger schematically illustrated in FIG. 1 and of a circuit arrangement for reshaping a pulse edge data signal into an amplitude data signal in accordance with the teachings of the present invention.

FIG. 2 illustrates in greater detail the Schmitt trigger STR and the circuit arrangement SCH. The Schmitt trigger STR comprises an operation amplifier OP, a plurality of resistors R1, R2, R3, and a capacitor C1. The operational amplifier has an inverting channel whose input is characterized by a minus sign and a non-inverting channel whose input is characterized by a plus sign. The output of the Schmitt trigger is connected by way of the resistor R1 to the non-inverting input. The circuits points P1 and P2 are connected to the positive and negative poles, respectively, of a voltage source (not shown). As already mentioned, the Schmitt trigger is fed with the signal D shown in FIG. 4, and the signal E is emitted by way of the output of the operational amplifier OP.

The circuit arrangement SCH comprises a pulse shaper FOR and two trigger stages K1 and K2. The signal F which is illustrated in FIG. 4 is produced from the signal E with the pulse shaper FOR and comprises rectangular pulses which coincide with the pulse edges of the signal E.

The trigger stages K1 and K2 each have a setting input $a$, a data input $b$ and a pulse train input $c$. The two trigger stages K1 and K2 each have an output $e$. The signals emitted by way of the outputs $e$ characterize the stable states of the two trigger stages which are referred to as 0-states and 1-states. With a 0-value or a 1-value at the output $e$, the relevant trigger stage assumes its 0-state or its 1-state, respectively. With a 0-signal or a 1-signal at the input $a$, the relevant trigger stage is brought into its 0-state or its 1-state, respectively, if it has not already assumed such state. With the 0-signal or 1-signal at the input $b$, the corresponding 0-state or 1-state of the trigger stage is produced only when the two trigger stages have not already assumed this state, and a positive pulse edge occurs at the pulse train input $c$. The 0-signals are permanently present at the circuit points P3 and P4.

With the signals F = 1 at the times $t1$, $t4$, $t6$, $t8$, $t10$, the trigger stage K1 is brought from its 0-state into its 1-state so that the signal G = 1 is emitted at the output $e$. As a 0-signal is permanently present at the input $b$, with the positive edges of the signal T2 the trigger stage K1 is brought into its 0-state at the times $t2$, $t5$, $t7$, $t9$, $t11$ and emits the signal G = 0. With the signal G = 1, and the positive pulse edges of the signal T2 which occur simultaneously at the times $t2$ and $t5$, the 1-states of the trigger stage K2 and the positive edges of the signal H occur. As a 0-signal is permanently present at the input $a$ of the trigger stage K2, at the time $t3$ the trigger stage K2 is reset into its 0-state with the positive edge of the timing signal T2. No resetting of the trigger state K2 into the 0-state occurs at the times $t7$, $t9$, $t11$ because the 1-state is maintained with the signal G = 1.

The signal H is produced purely digitally from the signal E. When the bit pattern of the signal E, and thus the speed of the 1-values changes, then there is also a change, within a wide range, in the bit pattern of the signal H without the necessity of making manual adjustments in order to take into account different speeds of the data transmitted with the signal E. Here, it is assumed that the pulse duration of the rectangular pulses of the signal F is small in relation to the duration of one bit, for example the duration $t6$–$t4$. The duration of the rectangular pulses of the signal F can, for example, amount to 1/1000 of the bit duration.

Figure 3:
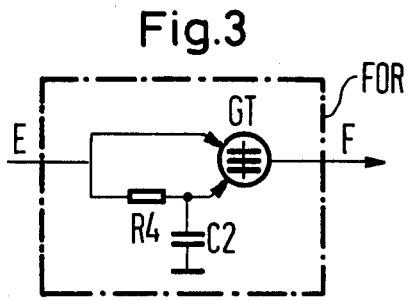
FIG. 3 is a more detailed illustration of a pulse shaper which is also schematically shown in FIG. 2.

FIG. 3 illustrates an exemplary embodiment of the pulse shaper FOR schematically illustrated in FIG. 2, having a resistor R4, a capacitor C2 and a NOT-equivalence gate GT. The pulse shaper is characterized in that, at a low expense, it produces a signal F which possesses steep edges and whose rectangular pulses have a very short duration in comparison to the bit duration. The gate GT emits a signal F = 1 only when the binary values present at its two inputs are unequal. The resistor R4 and the capacitor C4 together form a differentiator element which produces a needle pulse at the times $t1$, $t4$, $t6$, $t8$, $t10$ with the pulse edges of the signal E. Unequal signals are present at the inputs of the gate GT only during the duration of the needle pulses, so that the rectangular pulses, of short duration, of the signal F = 1, are produced. With the pulse shaper it is possible to produce rectangular pulses of the signal F = 1 whose duration amounts to approximately 1/1000 of the shortest bit duration.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for reshaping a pulse edge data signal, whose pulse edges signal binary values of data, into an amplitude data signal, whose amplitudes signal the binary values of the data, comprising:
- a pulse generator for producing timing pulses having a period equal to the duration of the individual binary values;
- a pulse shaper including an input and an output, said pulse shaper receiving the pulse edge data signal at said input and responsive to emit a rectangular signal at said output having short duration pulses corresponding to the pulse edges of the pulses of the pulse edge data signal; and
- first and second bistable trigger circuits each including a setting input, a data input, a pulse train input and an output which emits binary values which signal the stable states,
- said pulse train inputs of said trigger circuits connected to said pulse generator, and said data input of said first trigger circuit and said setting input of said second trigger circuit connected to a reference valve,
- said setting input of said first trigger circuit connected to said pulse shaper to receive and rectangular signal,
- said first trigger circuit responsive to a rectangular pulse of said rectangular signal to assume one state and responsive to a timing pulse, in the absence of a rectangular pulse, to assume the other state,
- said output of said first trigger circuit connected to said data input of said second trigger circuit, and
- said second trigger circuit assumming the stable state of said first trigger circuit in response to its data input and an edge of a timing pulse to emit the amplitude data signal at its output.

2. The circuit arrangement of claim 1, wherein said pulse shaper comprises:
- a differentiator; and
- a NOT-equivalence gate including first and second inputs and an output,
- said input of said pulse shaper connected directly to said first input of said gate and to said second input of said gate via said differentiator,
- said output of said gate constituting said output of said pulse shaper.

3. The circuit arrangement of claim 1, wherein said output of said pulse shaper is connected to said pulse generator to synchronize the operation of said pulse generator.

* * * * *